United States Patent
Haraguchi et al.

[11] Patent Number: 5,851,296
[45] Date of Patent: Dec. 22, 1998

[54] VACUUM PROCESSING APPARATUS AND METHOD

[75] Inventors: Hideo Haraguchi, Toyonaka; Masaki Suzuki; Toshimichi Ishida, both of Hirakata, all of Japan

[73] Assignee: Matsushita Electric Industrial Co., Ltd., Kadoma, Japan

[21] Appl. No.: 814,018

[22] Filed: Mar. 10, 1997

Related U.S. Application Data

[62] Division of Ser. No. 380,713, Jan. 30, 1995, Pat. No. 5,636,963.

[30]    Foreign Application Priority Data

Jan. 31, 1994  [JP]  Japan ................................. 6-9225

[51] Int. Cl.[6] .................................................. C23C 16/54
[52] U.S. Cl. .......................... 118/719; 414/786; 414/217; 414/935; 414/939; 414/941; 414/222; 414/937; 414/744.5
[58] Field of Search ............................ 118/719; 414/786, 414/217, 935, 939, 941, 222, 937, 744.5

[56]              References Cited

U.S. PATENT DOCUMENTS 5,083,896  1/1992  Uehara et al. ........................ 414/744.5
5,407,314  4/1995  Kempf ..................................... 414/217

Primary Examiner—Shrive Beck
Assistant Examiner—Timothy Meeks
Attorney, Agent, or Firm—Wenderoth, Lind & Ponack, L.L.P.

[57]               ABSTRACT

A vacuum processing apparatus includes a reaction chamber, a non-reaction chamber which is a load-lock chamber or a double load-lock chamber. A double arm is accommodated in the non-reaction chamber, and includes a first arm and a second arm for taking out a processed wafer from the reaction chamber and supplying an unprocessed wafer to the reaction chamber. Wafer elevating mechanisms are provided in the reaction chamber and the non-reaction chamber. The double arm and the wafer elevating mechanisms are driven by a single drive source. Also, a selective engagement mechanism is provided at the reaction chamber and at the non-reaction chamber for selectively engaging the driving source with any one of the wafer elevating mechanisms at the reaction chamber and the non-reaction chamber to drive the double arm and the wafer elevating mechanism at the selected chamber.

11 Claims, 10 Drawing Sheets

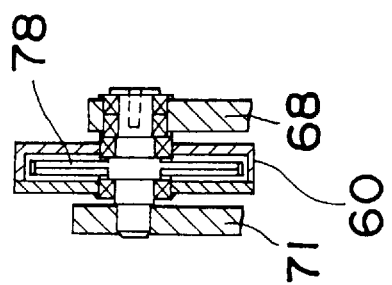
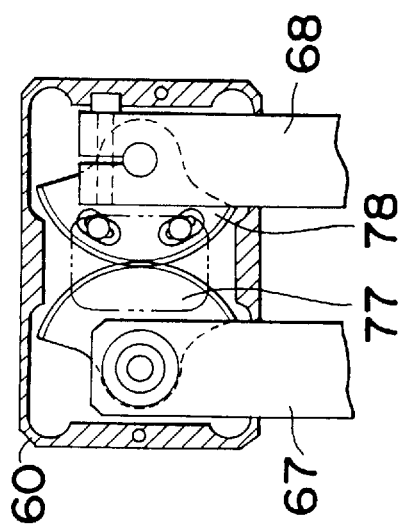
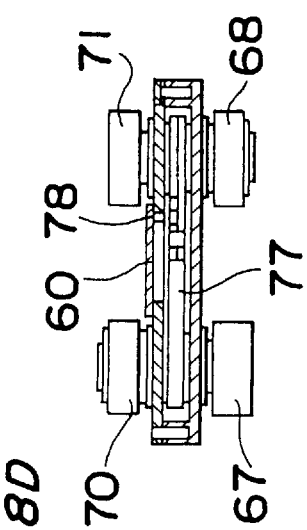
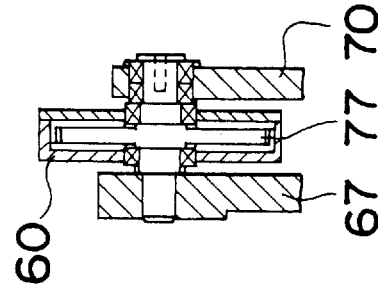

VACUUM PROCESSING APPARATUS AND METHOD

This is a divisional application of Ser. No. 08/380,713, filed Jan. 30, 1995 now U.S. Pat. No. 5,636,963.

BACKGROUND OF THE INVENTION

The present invention relates to a vacuum processing apparatus and method for forming a semiconductor or a thin film.

An example of a conventional vacuum processing apparatus is described below with reference to FIGS. 14 and 15. The vacuum processing apparatus comprises a wafer cassette elevating device 1; a wafer feeding arm moving forward and backward; a feeding arm 2 which rotates; a load-lock chamber 3; and a wafer elevating base 19 to be moved upward and downward by a cylinder 20 in the load-lock chamber 3. The vacuum processing apparatus further comprises a double load-lock chamber 4; an upper arm 8 and a lower arm 9 accommodated in the double load-lock chamber 4 and driven by pulse motors 16 and 17, respectively; a double arm rotating pulse motor 18 accommodated in the double load-lock chamber 4 and connected with the upper and lower arms 8 and 9 via a vacuum seal 10; and rotary encoders 13, 14, and 15 provided for each of the pulse motor 18, the arm 8, and the arm 9. In each of the reaction chambers 5, 6, and 7, a lower electrode 23, a pushing cylinder 12, and three wafer pushing pins 11 are provided. A gate is provided in each of the reaction chambers 5, 6, and 7 to partition the reaction chambers 5, 6, and 7 from the double load-lock chamber 4. The description of the construction and operation of the gate is omitted herein.

The operation of the vacuum processing apparatus is described below. A wafer 22A taken out from a wafer cassette 21A by means of the wafer cassette elevating device 1 and the feeding arm 2 is moved to the load-lock chamber 3 and placed on the wafer elevating base 19. Then, the load-lock chamber 3 is evacuated. While the wafer elevating base 19 is moving upward, one of the upper and lower arms 8 and 9 positioned in the double load-lock chamber 4 moves into the load-lock chamber 3. Then, the wafer elevating base 19 moves downward to receive the wafer 22A by the arm, thus returning to the double load-lock chamber 4. The upper and lower arms 8 and 9 are rotated by the double arm rotating pulse motor 18 until they face to the reaction chamber 5. Thereafter, the cylinder 12 moves the wafer pushing pins 11 upward to move a processed wafer 22B upward. Then, the arm 8 or 9 not holding the wafer moves into the reaction chamber 5. After the wafer pushing pins 11 move downward, the arm 8 or 9 receives the processed wafer 22B and returns to the double load-lock chamber 4. After the arm 8 or 9 holding the wafer moves into the reaction chamber 5, the wafer pushing pins 11 move upward to receive the unprocessed wafer 22A and then, the arm 8 or 9 returns to the double load-lock chamber 4. In the operation of the upper and lower arms 8 and 9, and the rotary motion of the double arm rotating pulse motor 18, the stroke limit of each operation is detected by the rotary encoders 13, 14, and 15, respectively to start a subsequent operation after each operation is completed. Then, the upper and lower arms 8 and 9 rotate until they face to the reaction chamber 6 so as to receive the processed wafer 22B and transfer the unprocessed wafer 22A to the wafer pushing pins 11 in the reaction chamber 6, as in the case of the operation to be performed in the reaction chamber 5. After the same operation is performed in the reaction chamber 7, the upper and lower arms 8 and 9 rotate until they face to the load-lock chamber 3 and then, the arm 8 or 9 is extended to the position below the wafer to receive an unprocessed wafer from the wafer elevating base 19 which is at the upward position. Then, the arm 8 or 9 holding the unprocessed wafer is rotated to the double load-lock chamber 4. Sequentially, the arm 8 or 9 holding the processed wafer is extended to the wafer supply portion of the load-lock chamber 3 so as to transfer the processed wafer to the wafer elevating base 19, thus returning to the double load-lock chamber 4. Thereafter, the pressure in the load-lock chamber 3 is returned to the atmospheric pressure so that the feeding arm 2 takes out the processed wafer from the wafer cassette 21A and returns it to the cassette 21B. In this manner, a sequence of wafer feeding operations terminates.

In the vacuum processing apparatus having the above construction, while the wafer is being fed, it is necessary to start a subsequent operation after detecting the termination of the reciprocation operation of the upper and lower arms 8 and 9, that of the vertical movement of the wafer pushing pins 11, and that of the wafer elevating base 19. Thus, the entire operation time period takes long. Moreover, it is necessary to move the cylinder 12 at a low speed to reduce the degree of shock generated when moving the wafer upward and then stopping the movement. Thus, it takes long time for the vacuum processing apparatus to process the wafer. Further, it takes a long time to perform the vacuum break required to correct mistakes which have occurred in handling the wafer. Further, in a sequence control over a plurality of mechanisms, there is the possibility that malfunctions will occur in processing the wafer after a power failure or while an irregular operation is being performed.

SUMMARY OF THE INVENTION

The object of the present invention is to provide an improved vacuum processing apparatus and method capable of accomplishing the operation of a double arm and a wafer elevating operation by a single driving source so as to reduce the time required to process the wafer and achieve a reliable operation.

In accomplishing these and other objects, according to one aspect of the present invention, there is provided a vacuum processing apparatus comprising:
 a reaction chamber;
 a non-reaction chamber which is a load-lock chamber or a double load-lock chamber;
 a double arm, accommodated in the non-reaction chamber, comprising a first and second arms for taking out a processed wafer from the reaction chamber and supplying an unprocessed wafer to the reaction chamber;
 wafer elevating mechanisms provided in the reaction chamber and the non-reaction chamber;
 a driving means for driving the double arm and the wafer elevating mechanisms by a single drive source; and
 a selective engagement mechanism provided at the reaction chamber and the non-reaction chamber and the wafer elevating mechanism, for selectively engaging the driving means with any one of the wafer elevating mechanisms at the reaction chamber and the non-reaction chamber to drive the double arm and the wafer elevating mechanism at the selected chamber.

According to another aspect of the present invention, there is provided a vacuum processing method which is used in a vacuum processing apparatus comprising:

a reaction chamber;

a non-reaction chamber which is a load-lock chamber or a double load-lock chamber;

a double arm, accommodated in the non-reaction chamber, comprising a first and second arms for taking out a processed wafer from the reaction chamber and supplying an unprocessed wafer to the reaction chamber;

wafer elevating mechanisms provided in the reaction chamber and the non-reaction chamber;

a driving means for driving the double arm and the wafer elevating mechanisms by a single drive source; and a selective engagement mechanism provided at the reaction chamber and the non-reaction chamber and the wafer elevating mechanism, for selectively engaging the driving means with any one of the wafer elevating mechanisms at the reaction chamber and the non-reaction chamber to drive the double arm and the wafer elevating mechanism at the selected chamber, the method comprising:

a first step of stopping moving the first arm and the second arm in the non-reaction chamber, and driving the wafer elevating mechanism to upward move a wafer receiving member to place a processed wafer on the wafer receiving member in the reaction chamber;

a second step of moving the first arm from the non-reaction chamber to the reaction chamber, stopping moving the second arm in the non-reaction chamber, and stopping moving the wafer receiving member at a position capable of transferring the processed wafer between the arm and the wafer receiving member;

a third step of stopping moving the first arm in the reaction chamber, stopping moving the second arm in the non-reaction chamber, and driving the wafer elevating mechanism to move the wafer receiving member downward from the position so as to transfer the wafer on the wafer receiving member from the wafer receiving member to the first arm in the reaction chamber;

a fourth step of moving the first arm from the reaction chamber to the non-reaction chamber together with the processed wafer; moving the second arm from the non-reaction chamber to the reaction chamber together with an unprocessed wafer; and stopping driving the wafer elevating mechanism;

a fifth step of stopping moving the first arm in the non-reaction chamber, stopping moving the second arm in the reaction chamber, and driving the wafer elevating mechanism to move the wafer receiving member upward so as to transfer the unprocessed wafer on the second arm from the second arm to the wafer receiving member in the reaction chamber;

a sixth step of stopping moving the first arm in the non-reaction chamber, moving the second arm from the reaction chamber to the non-reaction chamber, and stopping the wafer receiving member to the position; and a seventh step of stopping moving the first arm in the non-reaction chamber, stopping moving the second arm in the non-reaction chamber, and driving the wafer elevating mechanism to move the wafer receiving member downward together with the unprocessed wafer.

BRIEF DESCRIPTION OF THE DRAWINGS

These and other objects and features of the present invention will become clear from the following description taken in conjunction with the preferred embodiments thereof with reference to the accompanying drawings, in which:

FIGS. 8A, 8B, 8C, and 8D are a sectional left side view, a sectional plan view, a sectional right side view, and a sectional front view, respectively showing an arm gear box of the apparatus according to the first embodiment of the present invention;

DETAILED DESCRIPTION OF THE INVENTION

Figure 1:
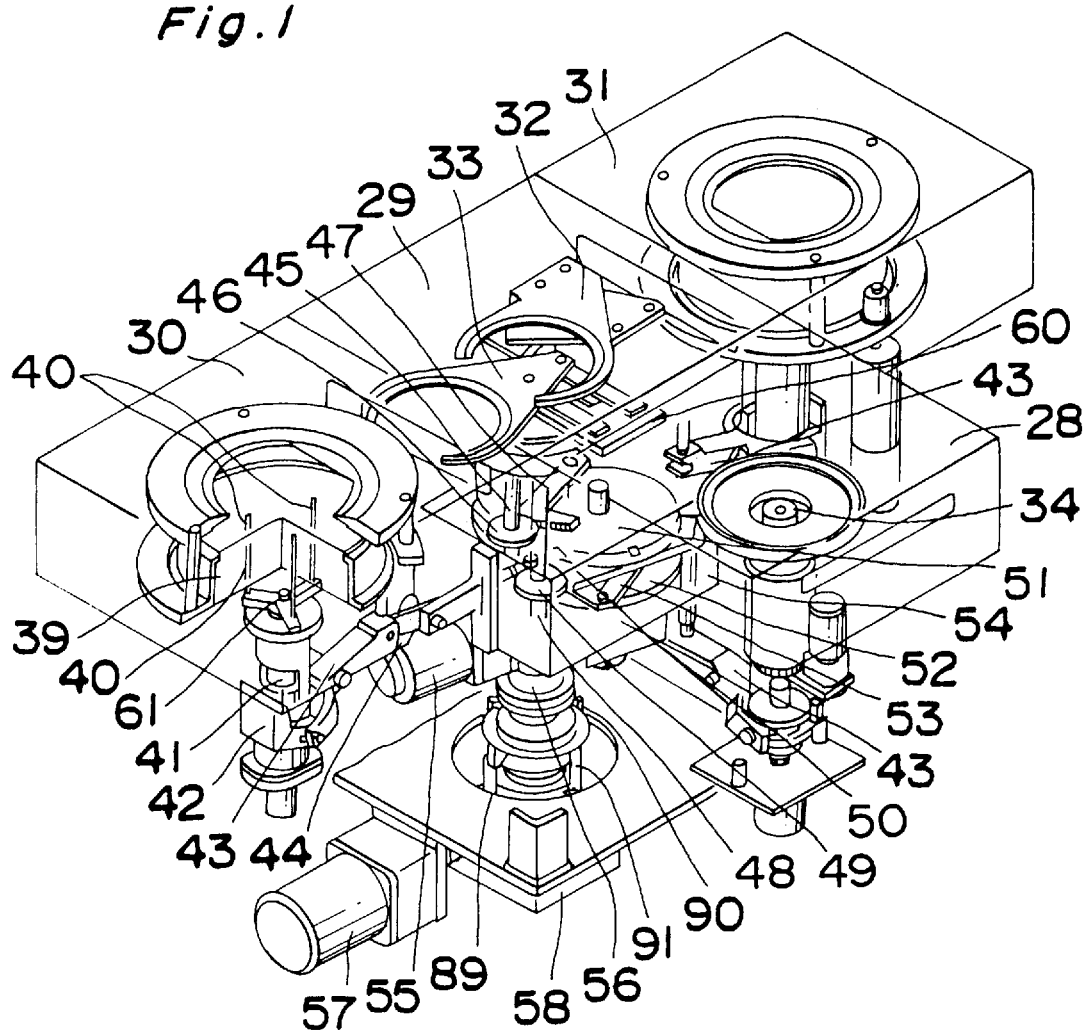
FIG. 1 is a perspective view showing the construction of a wafer feeding mechanism of a vacuum processing apparatus according to a first embodiment of the present invention.

Before the description of the present invention proceeds, it is to be noted that like parts are designated by like reference numerals throughout the accompanying drawings.

A vacuum processing apparatus according to a first embodiment of the present invention is described below with reference to FIGS. 1 through 12. The vacuum processing apparatus includes a wafer cassette 24; a cassette elevating device 26; a feeding arm 27; a load-lock chamber 28; a double load-lock chamber 29; reaction chambers 30 and 31; and a wafer elevating base 34 accommodated in the load-lock chamber 28.

Figure 3:
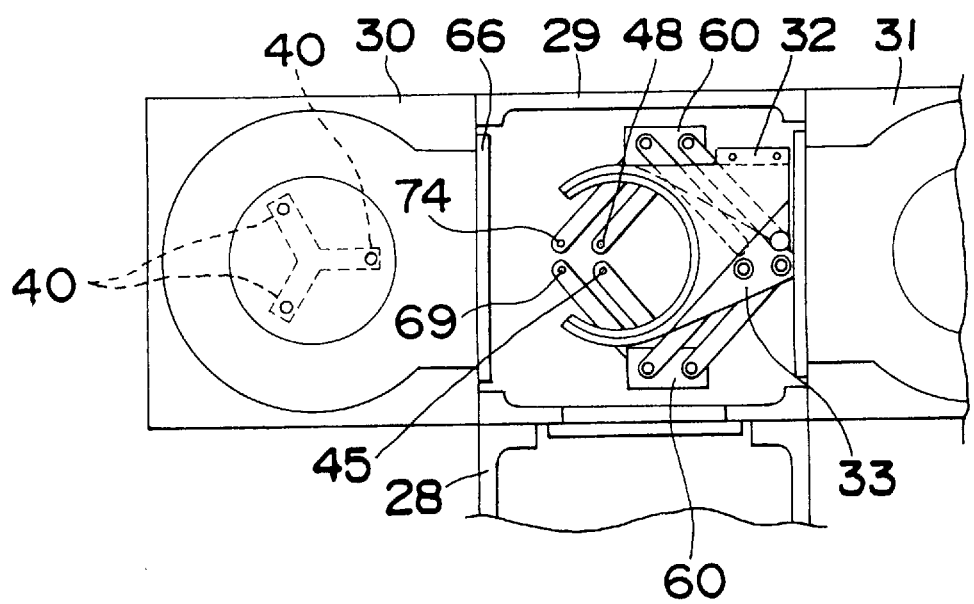
FIG. 3 is a partial plan view showing the wafer feeding mechanism of the vacuum processing apparatus according to the first embodiment of the present invention.
Figure 4:
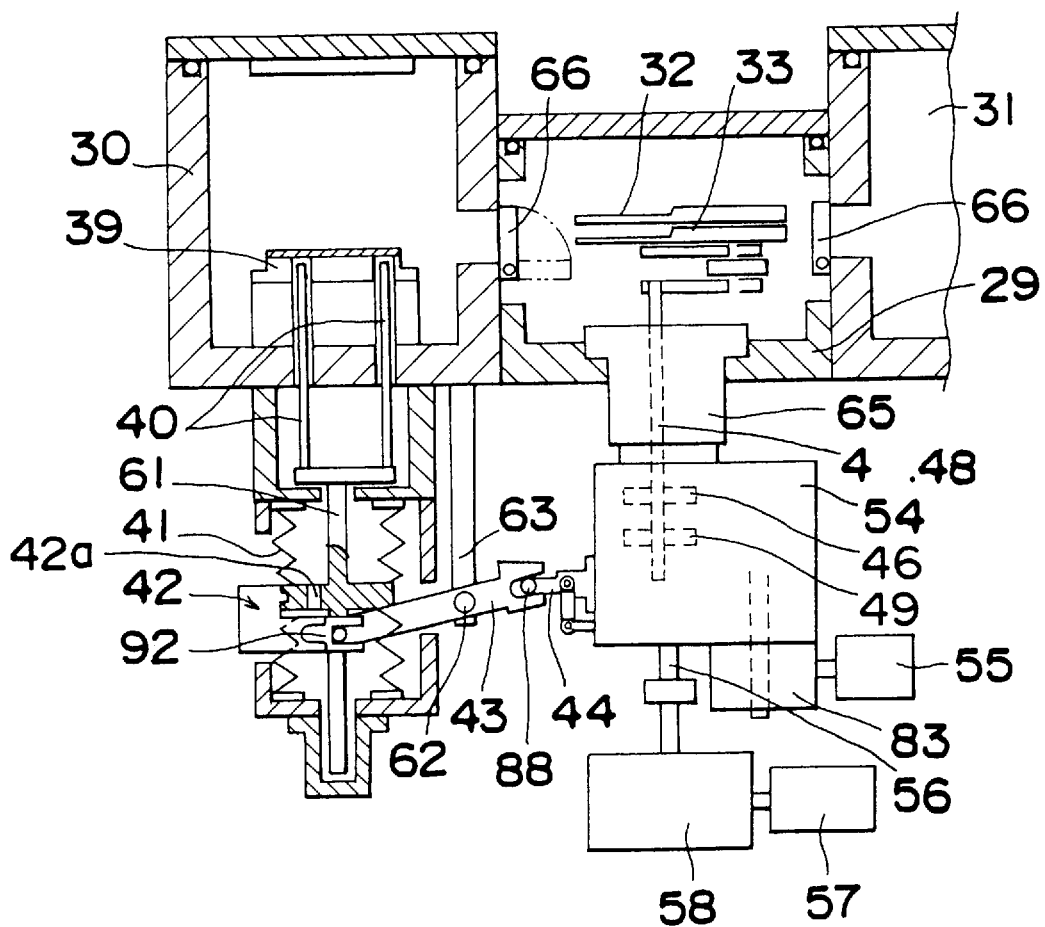
FIG. 4 is a vertical sectional view showing a wafer elevating mechanism of the apparatus according to the first embodiment of the present invention.

The constituent parts of the vacuum processing apparatus are described below with reference to FIGS. 1, 3, and 4.

A lower electrode 39 is accommodated in each of the reaction chambers 30 and 31. Three pushing pins 40 are provided inside the lower electrode 39. A shaft 61, vertically movable, connected with the pushing pins 40 is positioned below the pushing pins 40. A bellows 41 is mounted in a middle of the periphery of the shaft 61. A grooved metal fitting 42 is mounted on the shaft 61. A pillar 63 extends downward from the lower end of each reaction chamber 30, 31. A pin elevating fork 43 is pivotably installed on the pillar 63 via a supporting point 62. A roller 92 is installed between both ends of a fork portion at one end of the pin elevating fork 43. The roller 92 is engaged into a groove portion of the grooved metal fitting 42. The grooved metal fitting 42 has a penetrating hole 42a for connecting upper and lower spaces which are defined by the bellows 41 and the grooved metal fitting 42 etc. and uniforming or equalizing the pressure at the upper and lower spaces so as to smoothly move the shaft 61 upwardly and downwardly in the bellows 41.

An upper arm 32, a lower arm 33, and joint mechanisms for driving the upper and lower arms 32 and 33 are provided in the double load-lock chamber 29. The upper and lower arms 32 and 33 are respectively installed on the upper ends of shafts 45 and 48 extending through a vacuum seal 65. An upper arm driving gear 46 and a lower arm driving gear 49 are installed on lower portions of the shafts 45 and 48, respectively.

Figure 9A:
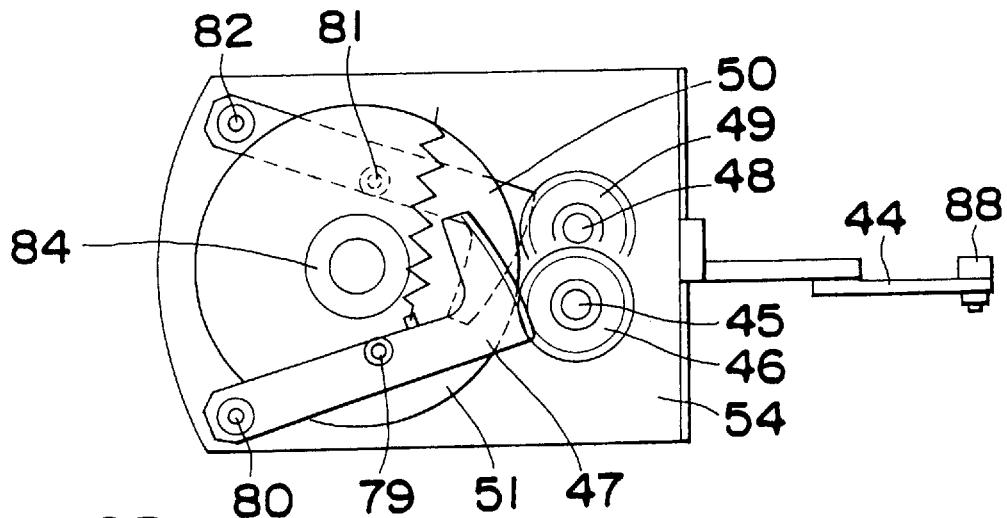
FIG. 9A is a plan view showing a cam box of the apparatus according to the first embodiment of the present invention.
Figure 9B:
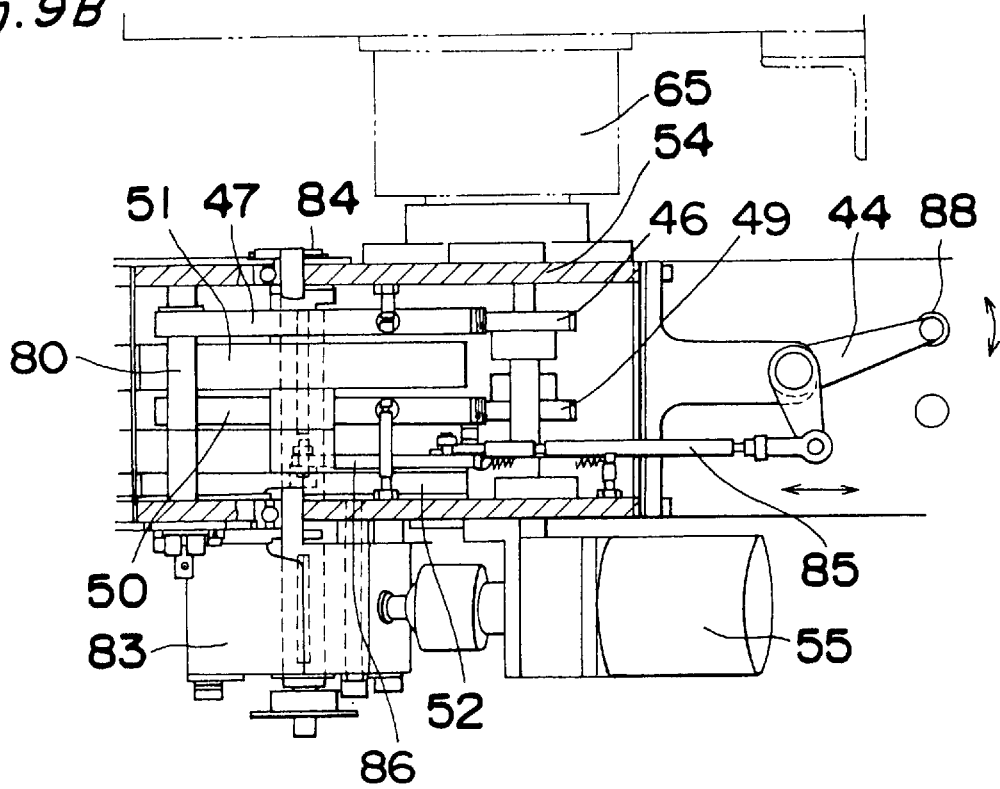
FIG. 9B is a vertical sectional view showing the cam box of the apparatus according to the first embodiment of the present invention.
Figure 10:
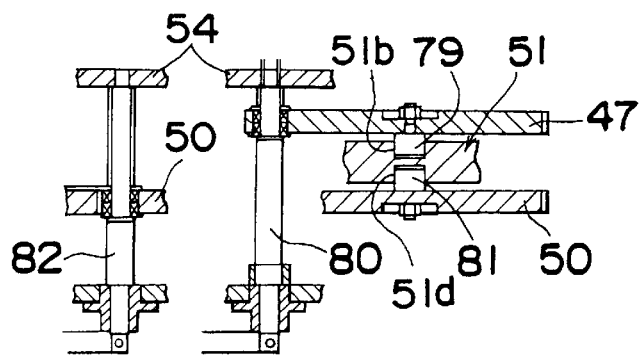
FIG. 10 is a vertical sectional view showing a grooved cam of the double arm accommodated inside the cam box of the apparatus according to the first embodiment of the present invention.

As shown in FIGS. 9A and 9B, circular gears 47 and 50 engage the lower arm driving gear 46 and the upper arm driving gear 49, respectively. A cam follower 79 for the upper arm 32 is fixed to the circular gear 47 at an intermediate position between the gear portion thereof and a supporting point 80. Similarly, a cam follower 81 for the lower arm 33 is fixed to the circular gear 50 at an intermediate position between the gear portion thereof and a supporting point 82. As shown in FIG. 10, the cam followers 79 and 81 engage grooved cam portions 51b, 51d formed on the upper and lower surfaces of a grooved cam plate 51, respectively.

Figure 16:
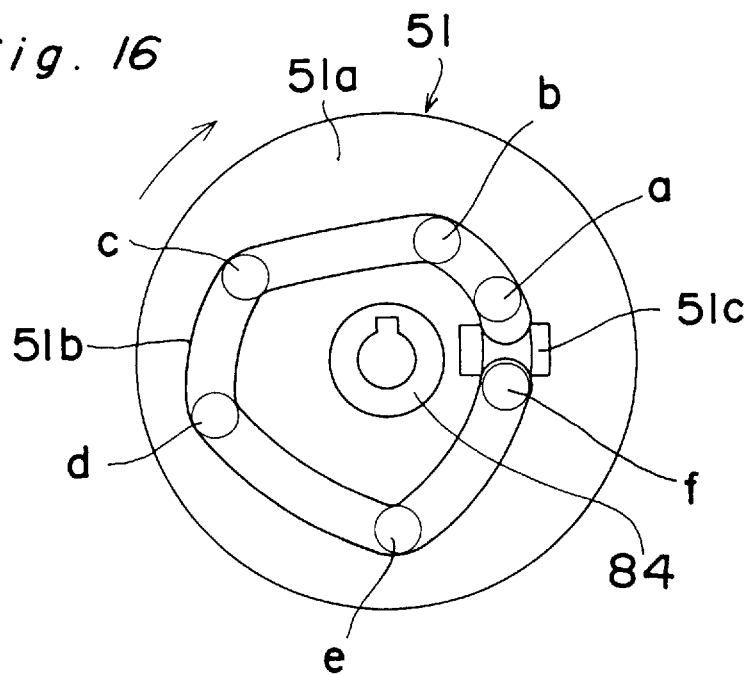
FIGS. 16 and 17 are plan views of the cams.

The grooved cam portion 51b formed on the upper surface 51a of the grooved cam plate 51 is shown in FIG. 16. The configuration of the grooved cam portion 51b is so designed that the cam follower 79 engaging the grooved cam portion 51b is moved to drive the upper arm 32 to sequentially perform operations of 0°–180°–340° and vice versa in FIG. 12. That is, points (a), (b), (c), (d), (e), and (f) in FIG. 12 respectively indicate portions (a), (b), (c), (d), (e), and (f) in FIG. 16. Reference numeral 51c denotes a stopper to restrict the movement of the cam follower 79 in the grooved cam portion 51b within an angle of 20°. Then, when the grooved cam plate 51 rotates in a direction shown by an arrow in FIG. 16, the cam follower 79 starts to move from the point (a) towards the point (b). During the points (a)–(b), the upper arm 32 stops moving and is not extended to receive or transfer a wafer. During the points (b)–(c), the upper arm 32 starts to extend to receive or transfer a wafer. During the points (c)–(d), the upper arm 32 is extended and receives or transfers a wafer. During the points (d)–(e), the upper arm 32 is contracted. During the points (e)–(f), the upper arm 32 stops moving. After the cam follower 79 reaches the point (f), the grooved cam plate 51 stops rotating. Then, when the rotation shaft 84 is rotated by the double arm driving motor 55, the grooved cam plate 51 is rotated in an opposite direction to the direction shown by the arrow in FIG. 16. Then, the cam follower 79 starts to move from the point (f) towards the point (a) through the points (e)–(b) while the upper arm 32 performs the above operations of 340°–180°–0° in FIG. 12.

The grooved cam portion 51d formed on the lower surface of the grooved cam plate 51 is similar to that of the groove cam portion 51b of FIG. 16. The configuration of the grooved cam portion 51d is so designed that the cam follower 81 engaging the grooved cam portion 51d is moved to drive the lower arm 33 to sequentially perform operations of 0°–180°–340° and vice versa in FIG. 12.

Figure 17:
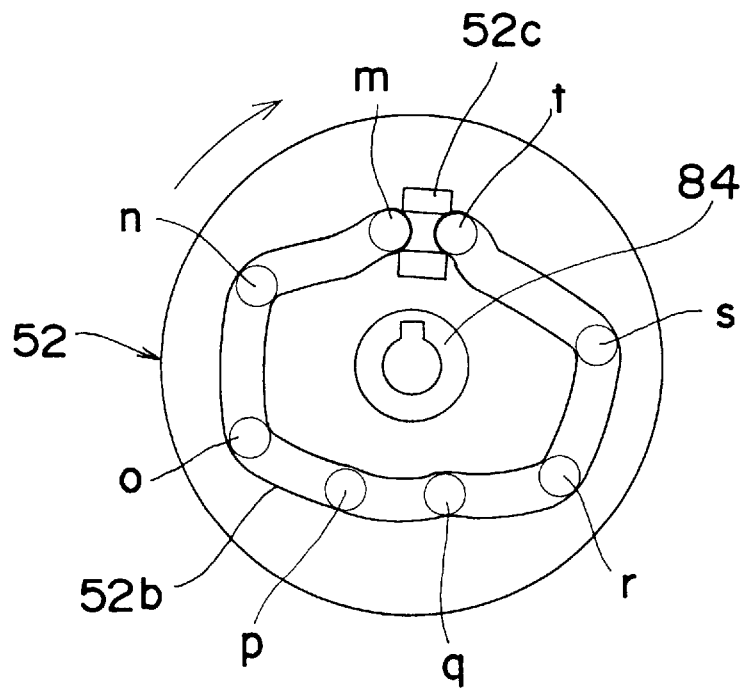

As shown in FIG. 9B, a wafer pushing grooved cam 52 is connected with a rotation shaft 84 of the grooved cam plate 51 to rotate together with the wafer pushing grooved cam 52. The grooved cam portion 52b formed on one surface of the wafer pushing grooved cam 52 is shown in FIG. 17. The configuration of the grooved cam portion 52b is so designed that the cam follower 87 engaging the grooved cam portion 52b is moved to drive the pushing pins 40 to sequentially perform operations of 0°–180°–340° and vice versa in FIG. 12. That is, points (m), (n), (o), (p), (q), (r), (s), and (t) in FIG. 12 respectively indicate portions (m), (n), (o), (p), (q), (r), (s), and (t) in FIG. 17. Reference numeral 52c denotes a stopper to restrict the movement of the cam follower 87 in the grooved cam portion 52b within an angle of 20°. Then, when the grooved cam 52 rotates in a direction shown by an arrow in FIG. 17, the cam follower 87 starts to move from the point (m) towards the point (n). During the points (m)–(n), the pushing pins 40 start to move upward. During the points (n)–(o), the pushing pins 40 push a wafer upward. During the points (o)–(p), the pushing pins 40 start to move downward to prepare the next holding of a wafer. During the points (p)–(q), the pushing pins 40 stop moving to prepare the next holding of a wafer. During the points (q)–(r), the pushing pins 40 start to move upward to receive a wafer. During the points (r)–(s), the pushing pins 40 receive a wafer. During the points (s)–(t), the pushing pins 40 move downward to place the wafer on the lower electrode. After the cam follower 87 reaches the point (t), the grooved cam 52 stops rotating. Then, when the rotation shaft 84 is rotated by the double arm driving motor 55, the grooved cam 52 is rotated in an opposite direction to the direction shown by the arrow in FIG. 17. Then, the cam follower 87 starts to move from the point (t) towards the point (m) through the points (s)–(n) while the pushing pins 40 perform the above operations of 340°–180°–0° in FIG. 12.

Figure 11:
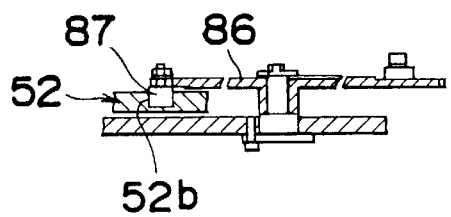
FIG. 11 is a sectional view showing a grooved cam of a pushing pin accommodated inside the cam box of the apparatus according to the first embodiment of the present invention.

As shown in FIG. 11, a cam follower 87 is provided at an end of a lever 86 and is engage in a grooved cam portion 52b of the wafer pushing grooved cam 52. A rod 85 of a turn buckle type is connected with the opposite end of the lever 86. As shown in FIG. 9B, the leading end of the rod 85 is connected with a pin pusher arm 44. A roller 88 is mounted on the leading end of the pin pusher arm 44. The roller 88 engages the grooved portion of the pin elevating fork 43 in the arm pivoting direction. Referring to FIG. 9B, the rotation shaft 84 of the grooved cam plate 51 is mounted on a hole formed on an output shaft of a worm speed reducer 83. A double arm driving motor 55 is connected with an input shaft of the worm speed reducer 83. Preferably, the double arm driving motor 55 has a function of providing a soft start for slowly driving the pushing pins 40 when the pins 40 move upward to lift a wafer from the lower electrode 39 and move downward to place the wafer on the lower electrode 39, so as to reduce dust caused at that time.

The above-described grooved cams 51, 52 and gears 47, 50 are accommodated in a cam box 54 attached to a rotary shaft of the vacuum seal 65. A shaft 56 coaxial with the rotary shaft of the vacuum seal 65 extends downward from the lower end of the cam box 54. The shaft 56 is connected with a double arm rotating motor 57 via an index unit 58. The index unit 58 is composed of a solid cam having a cam construction for stopping an output shaft at an allocated angle, for example, 90° with respect to the rotation of an input shaft.

Figure 5:
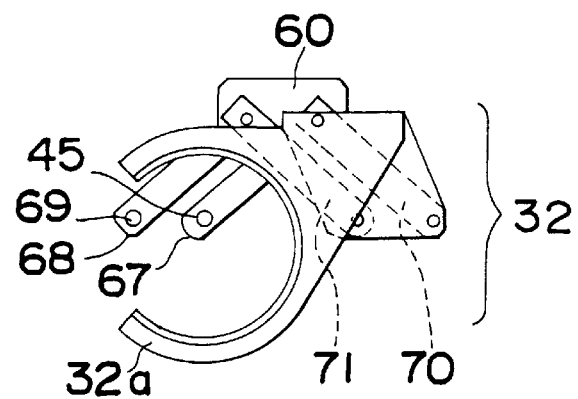
FIG. 5 is a plan view showing an upper arm of the apparatus according to the first embodiment of the present invention.
Figure 6:
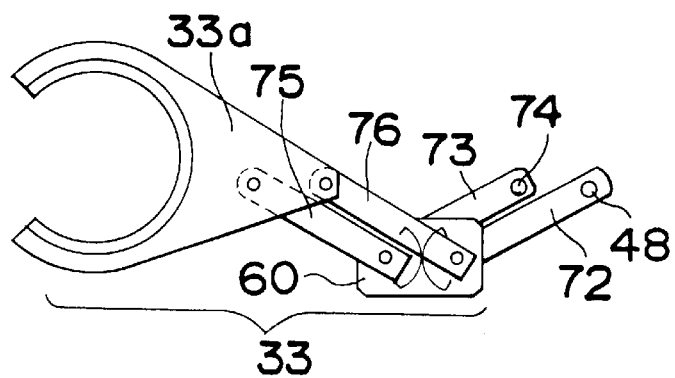
FIG. 6 is a plan view showing a lower arm of the apparatus according to the first embodiment of the present invention.
Figure 7:
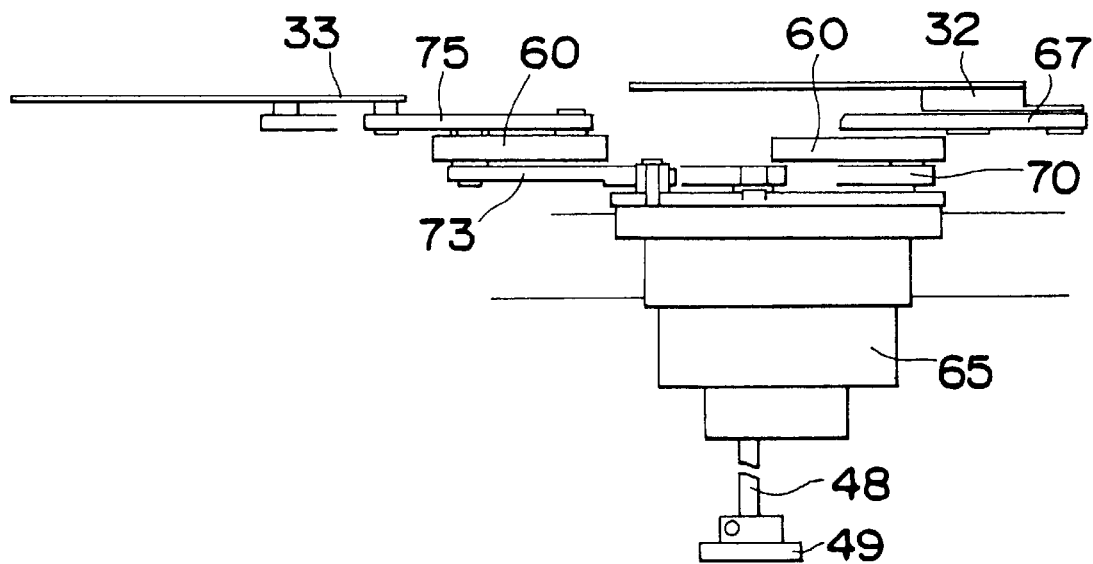
FIG. 7 is a side view showing a double arm of the apparatus according to the first embodiment of the present invention.

FIGS. 5, 6, 7, 8A through 8D show assemblies of the upper arm 32 and the lower arm 33. The assembly of the upper arm 32 includes a first front link 68; a second front link 71; a first rear link 67; a second rear link 70; and a wafer receiving member 32a as shown in FIG. 5. These links and the wafer receiving member 32 are connected with each other by means of hinge pins. As shown in FIGS. 8A–8D, a gear 77 fixed to the first rear link 67 engages a gear 78 fixed to the first front link 68. A gear box 60 is provided to keep the distance between the shafts of the gears 77 and 78 constant. The first front link 68 is fixed to the vacuum seal 65 by means of a hinge pin 69, while the first rear link 67 is fixed to the shaft 45 via the vacuum seal 65. The assembly of the lower arm 33 comprises a first front link 73; a second front link 75; a first rear link 72; a second rear link 76; and a wafer receiving member 33a as shown in FIG. 6. These links and the wafer receiving member 33a are connected with each other by means of hinge pins. The lower arm 33 has the same gear box 60 as the upper arm 32. The first front link 73 is fixed to the vacuum seal 65 by means of a hinge pin 74, while the first rear link 72 is fixed to the shaft 48 via the vacuum seal 65.

The above engaging mechanism in which the roller 88 of the pin pusher arm 44 on the driving side is engaged with the grooved portion of the pin elevating fork 43 can be provided at the reaction chamber 31 and the load-lock chamber 28. That is, as shown in FIG. 1, the reaction chamber 31 has the same mechanism as the reaction chamber 30, and the load-lock chamber 28 has the similar mechanism as the reaction chamber 30 except that the wafer elevating base 34 is provided instead of the pushing pins 40 so as to move the wafer elevating base 34 downward and upward in accordance with the pivotal movement of the pin elevating fork 43. Therefore, the roller 88 of the pin pusher arm 44 on the driving side is selectively engaged with the grooved portion of the pin elevating fork 43 at any one of the reaction chambers 30, 31 and the load-lock chamber 28 in accordance with the rotation of the cam box 54, and the motors 55, 57 etc.

A sequence of operations of the vacuum processing apparatus having the above construction is described below.

Figure 2:
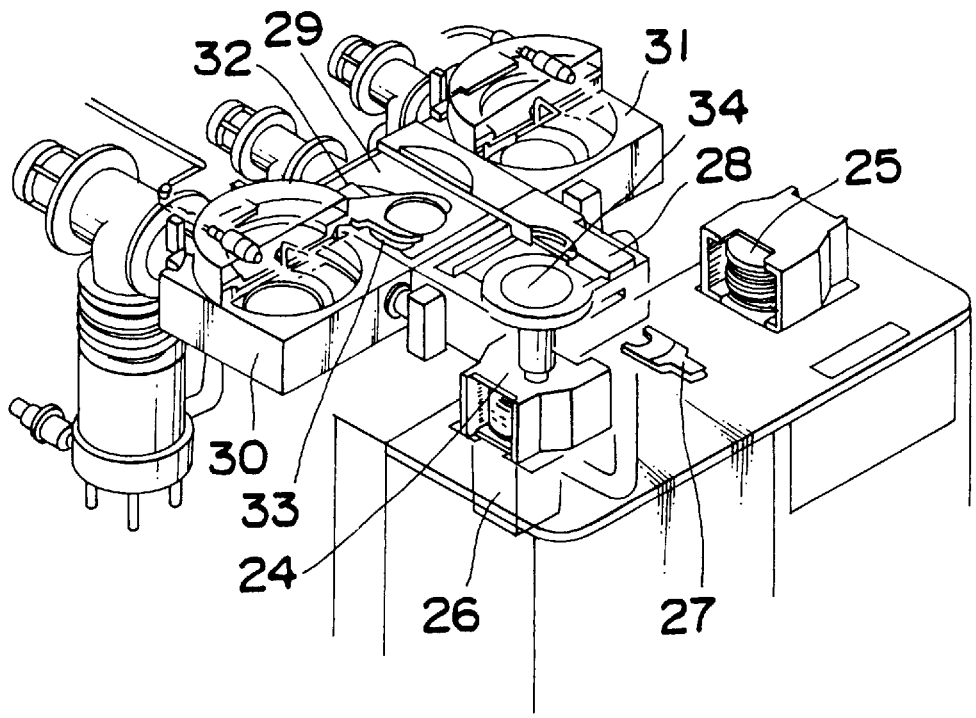
FIG. 2 is a perspective view showing the entire construction of the vacuum processing apparatus according to the first embodiment of the present invention.

Referring to FIG. 2, a wafer 25 taken out from the cassette 24 by the feeding arm 27 is transferred to the load-lock chamber 28 to start evacuating the load-lock chamber 28. As shown in FIGS. 9A and 9B, after the load-lock chamber 28 is evacuated, the double arm driving motor 55 starts to rotate. Then, the rotation of the grooved cam plates 51 and 52 cause the circular gears 47 and 50 and the lever 86 connected with the cam followers 79, 81, and 87, respectively to pivot. As a result, the wafer 25 is moved upward and downward by the pins 40 and the double arm is driven at a timing as shown in FIG. 12.

As shown in FIG. 11, the lever 86 is pivoted as a result of the rotation of the grooved cam 52 and the movement of the wafer pushing cam follower 87, thus actuating the pin pusher arm 44. The roller 88 mounted on the leading end of the pin pusher arm 44 presses the pin elevating fork 43 downward to clockwise pivot the pin elevating fork 43 around the supporting point 62. As a result, the wafer elevating base 34 moves upward (see the points (m)–(n) in FIG. 12) and stays at the upward position (see the points (n)–(o) in FIG. 12). Then, as a result of the pivotal motion of the gear 47 caused by the rotation of the grooved cam plate 51 and the movement of the upper arm cam follower 81, the upper arm driving circular gear 47 is pivoted on the supporting point 80, thus pivoting the upper arm driving gear 46 which is in engagement with the driving circular gear 47. As a result, the upper arm driving shaft 45 is pivoted via the vacuum seal 65.

Figure 12:
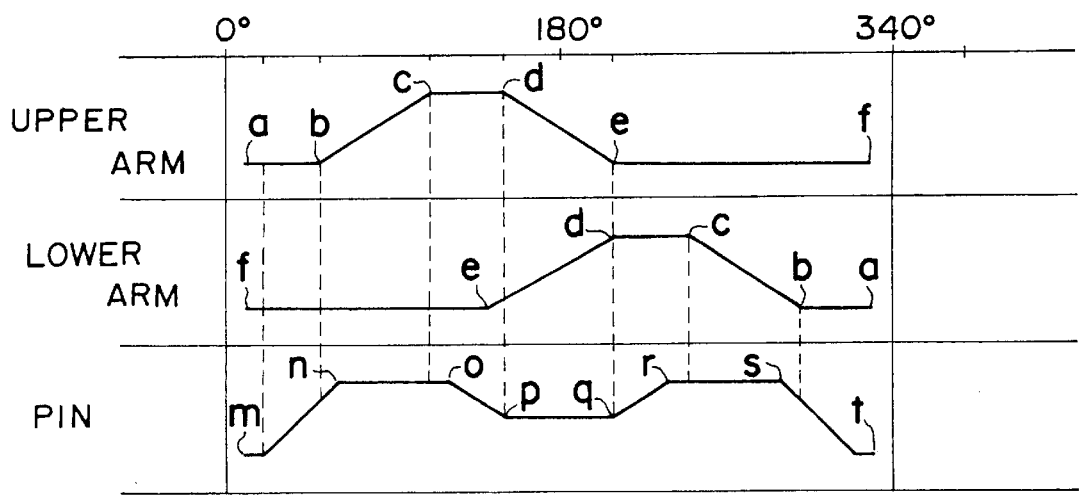
FIG. 12 is a timing diagram showing operations of three cams according to the first embodiment of the present invention.

As a result of this operation, the upper arm 32 moves into the center of the load-lock chamber 28 (see the points (b)–(d) in FIG. 12), and then the wafer elevating base 34 moves downward (see the points (o)–(p) in FIG. 12). As a result, the wafer is transferred from the wafer elevating base 34 to the upper arm 32. Then, the upper arm 32 moves back to the double load-lock chamber 29 (see the points (d)–(e) in FIG. 12). Sequentially, the lower arm 33 moves into the center of the load-lock chamber 28 (see the points (e)–(c) of the lower arm 33 in FIG. 12), and then the wafer elevating base 34 moves upward (see the points (q)–(r) in FIG. 12), thus transferring the processed wafer to the lower arm 33 and staying at the upward position (see the points (r)–(s) in FIG. 12). When the lower arm 33 has moved back to the double load-lock chamber 29 (see the points (c)–(b) of the lower arm 33 in FIG. 12), the wafer elevating base 34 moves downward (see the points (s)–(t) in FIG. 12). Consequently, the double arm driving motor 55 is stopped. In this manner, one cycle of operations terminates.

The operation of the upper arm assembly is described below. As shown in FIGS. 5 through 7 and 8A through 8D, the first rear link 67 of the upper arm 32 fixed to the shaft 45 is pivoted by the rotation of the double arm driving motor 55. As a result, the first front link 68 forming a parallel link with the gear box 60 is pivoted. The rotation of the first rear link 67 causes the rotation of the front arm gear 78 engaging the rear arm gear 77. As a result, the second front link 71 fixed to the front arm gear 78 is pivoted. Consequently, the second rear link 70 forming a parallel link with the wafer receiving member 32a is pivoted. As a result, the wafer receiving member 32a makes a linear motion. Similarly, in the case of the lower arm assembly vertically spaced at a certain interval from the upper arm assembly, the wafer receiving member 33a makes a linear motion. Although the upper arm 32 starts to be driven first in the first embodiment, the lower arm 33 may be driven first. After the cam shaft (rotation shaft) 84 stops at 340° in FIG. 12, the double arm motor 55 can rotate in only the opposite direction. As a result, the cam shaft (rotation shaft) 84 rotates 340°–180°–0°. Therefore, only the arm 32 or 33 not holding the wafer moves to the reaction chamber 30, 31 and thus no trouble occurs.

The pivotal motion of the double arm 32, 33 is described below. As shown in FIG. 4, initially, the double arm rotating motor 57 rotates. As a result, the double arm 32 and 33 facing the load-lock chamber 28 rotate together with the cam box 54 via the index unit 58 and then stop when the double arm 32, 33 faces to the reaction chamber 30. The roller 88 mounted on the leading end of the pin pusher arm 44 installed on the pivoting cam box 54 engages the pin elevating fork 43 opposed to the roller 88 and provided at the reaction chamber 30. When it is detected by a positional sensor 89 provided at the reaction chamber 30 that the double arm 32 and 33 is facing the reaction chamber 30, a gate 66 of the reaction chamber 30 is opened and then the double arm driving motor 55 starts to rotate in the direction opposite to that in the load-lock chamber 28. Consequently, the cam shaft 84 rotates from 340° to 0° as shown in FIG. 12. That is, the operations are performed in an order opposite to that described above. That is, first, the pin elevating fork 43 engaging the pin pusher arm 44 is actuated to push the shaft 61 engaging the pin elevating fork 43 upward. As a result, the three pins 40 fixed to the upper end of the shaft 61 move the wafer positioned in the reaction chamber 30 upward (see the points (t)–(r) in FIG. 12). Then, the lower arm 33 holding no wafer moves into the reaction chamber 30 (see the points (b)–(c) of the lower arm 33 in FIG. 12) and stops above the lower electrode 39 (see the points (c)–(d) of the lower arm 33 in FIG. 12). Sequentially, the three pins 40 move downward (see the points (r)–(q)), thus transferring the wafer to the lower arm 33. Simultaneously with the movement of the lower arm 33 back to the double load-lock chamber 29 (see the points (d)–(e) of the lower arm 33 in FIG. 12), the upper arm 32 holding an unprocessed wafer moves into the reaction chamber 30 (see the points (e)–(d) in FIG. 12) and stays above the lower electrode 39 (see the points (d)–(c) in FIG. 12). Then, the pushing pins 40 move upward (see the points (p)–(o) in FIG. 12). After transferring the wafer, the upper arm 32 moves to the double load-lock chamber 29 (see the points (c)–(b) in FIG. 12). Then, the gate 66 of the reaction chamber 30 is closed. With the downward movement of the pushing pins 40 (see the points (n)–(m) in FIG. 12), the wafer is placed on the lower electrode 39. In this manner, a wafer exchange operation terminates. Upon actuation of the double arm rotating motor 57, the double arm 32 and 33 rotate together with the cam box 54 until they face to the reaction chamber 31. When it is detected by a positional sensor 90 provided at the reaction chamber 31 that the pin pusher arm 44 has faced the reaction chamber 31 in engagement with the pin elevating fork 43 provided at the reaction chamber 31, the double arm driving motor 55 starts to rotate in the same direction as that in the load-lock chamber 28. That is, the wafer exchange is carried out by the double arm 32, 33, i.e., a processed wafer is transferred to the upper arm 32. Next, the double arm rotating motor 57 rotates until it faces the load-lock chamber 28. When it is detected by a positional sensor 91 provided at the load-lock chamber 28 that the double arm rotating motor 57 is facing the load-lock chamber 28, the double arm driving motor 55 rotates in the same direction as that in the load-lock chamber 30, thus causing the wafer exchange to be accomplished. When the pressure in the load-lock chamber 28 is returned to the atmospheric pressure, the processed wafer is accommodated in the wafer cassette 25. In this manner, a sequence of operations terminates.

As described above, in the conventional wafer feeding mechanism, after the stroke termination in the operation of the upper and lower arms and that of the pushing pins is detected, a subsequent operation is started, whereas according to the first embodiment, a sequence of operations is performed successively and parallel as shown in FIG. 2 and described above. Accordingly, it is possible to feed the wafer in a short period of time. The cam curve of the grooved cam portion 52b can be appropriately designed to reduce the degree of shock generated in the operation of moving the wafer upward. That is, depending on the configurations of the grooved cam portions 51b, 51d, 52b, the moving speed of the double arm 32, 33 and the pushing up speed of the pushing pins 40 can be desirably controlled. Additionally, since the pushing pins 40 are moved downward to the middle positions, not to the lowest positions when the pushing pins 40 wait to place a wafer thereon during the points (p)–(q), the operating time when the pushing pins 40 move downward and upward during the points (o)–(p) and (q)–(r) can be reduced. Further, only the wafer elevating mechanism in the reaction chamber facing the front of the arm is moved upward and downward after it is mechanically selected. Thus, the vacuum processing apparatus has a highly reliable mechanism.

The vacuum processing apparatus according to a second embodiment of the present invention is described below.

Referring to FIG. 9B, a speed control motor is adopted instead of the double arm, driving motor 55 of reversible type employed in the first embodiment. The speed control motor allows the wafer to be moved upward or stopped at a slow speed, thus preventing the wafer from bouncing.

Figure 13:
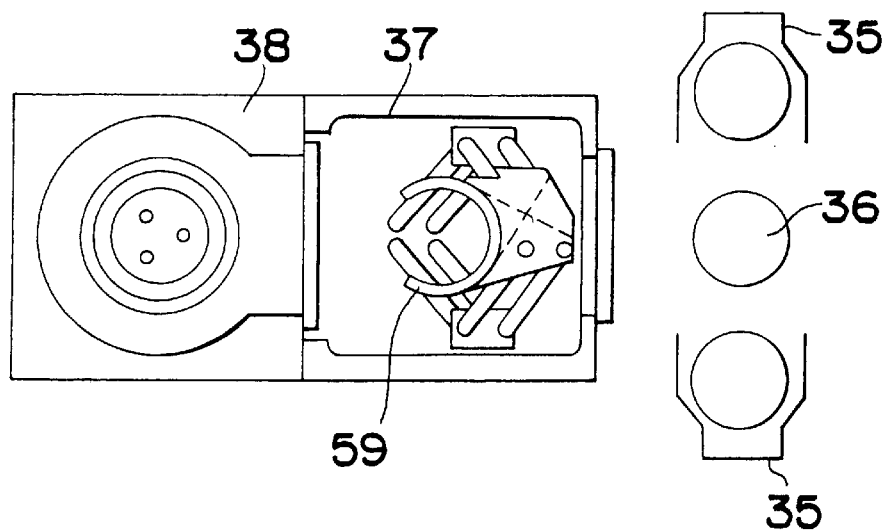
FIG. 13 is a plan view showing the entire construction of a vacuum processing apparatus according to a third embodiment of the present invention.
Figure 14:
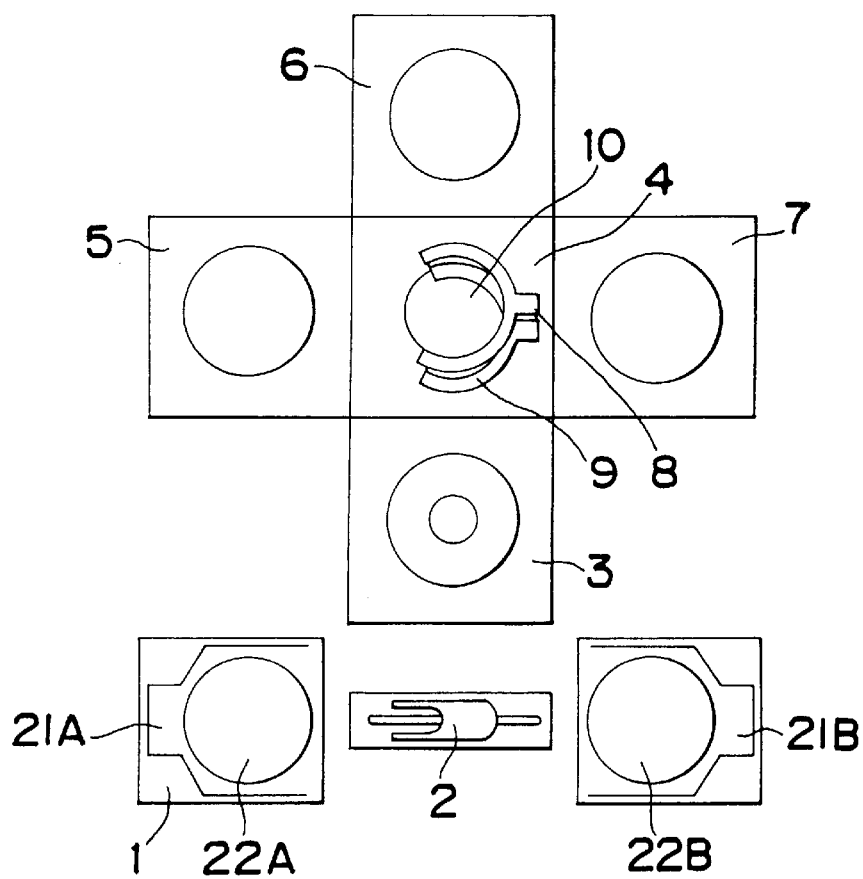
FIG. 14 is a plan view showing the construction of a conventional vacuum processing apparatus.
Figure 15:
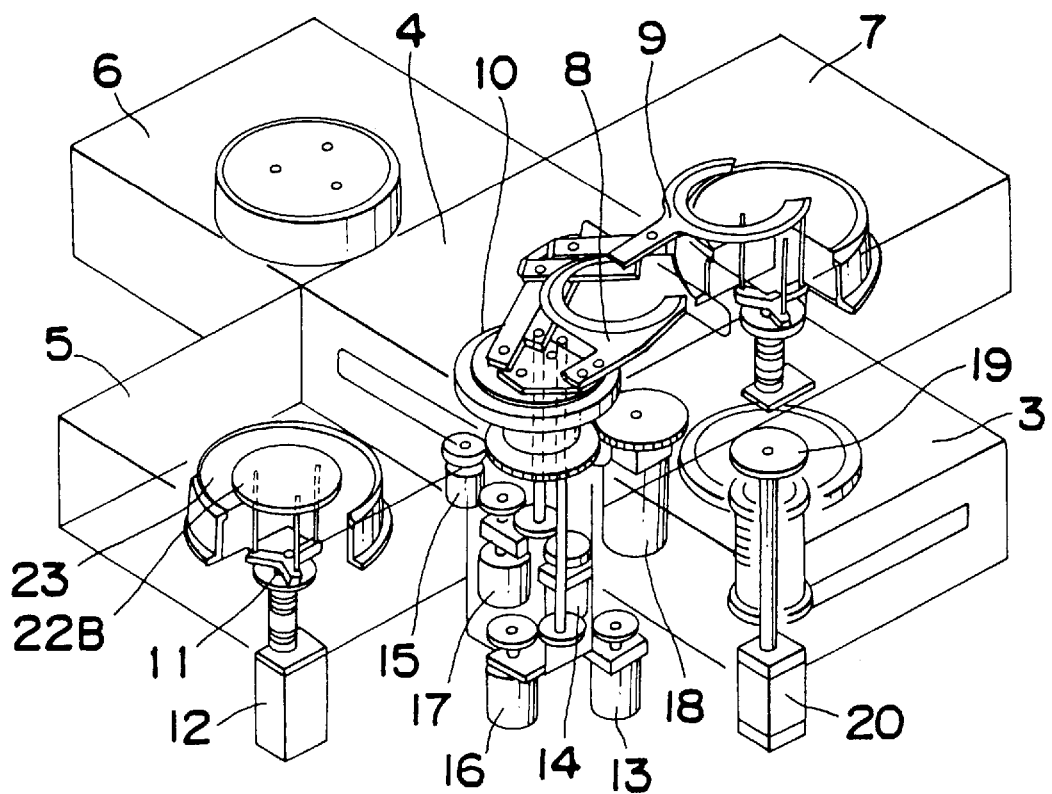
FIG. 15 is a perspective view showing the construction of a wafer feeding mechanism of the conventional vacuum processing apparatus shown in FIG. 14.

The vacuum processing apparatus according to a third embodiment of the present invention is described below. As shown in FIG. 13, a chamber accommodates a reaction chamber 38 and a load-lock chamber 37 housing double arm assemblies 59. A wafer supply section 36 is provided outside the load-lock chamber 37. The vacuum processing apparatus according to the third embodiment provides effect similar to that provided by the vacuum processing apparatus according to the first embodiment.

Although the vacuum processing apparatus is provided with two reaction chambers 30, 31 in the first embodiment, the transfer chamber may be polygonal and the allocation angle of the index unit may be varied to provide it with more chambers.

Since the index unit is used, the operation can be performed at a high speed and the engagement between the roller 88 and the grooved portion of the pin elevating fork 43 can be surely performed.

Since the gear box is used in each arm, it can prevent dusts from being produced and reduce a link mechanism.

According to the present invention, the operation of the double arm and the operation of moving the wafer vertically are performed by using one driving source. Therefore, a malfunction does not occur, and further, it is possible to feed the wafer in a short period of time. In addition, the mechanism for operating the double arm and the mechanism for operating the members for moving the wafer vertically are driven together, with the latter selectively engaging the appropriate wafer elevating mechanism, although the apparatus has a plurality of reaction chambers. Thus, a malfunction does not occur, and further, it is possible to feed the wafer in a short period of time.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A vacuum processing apparatus comprising:
   a first reaction chamber;
   a non-reaction chamber comprising a load-lock chamber or a double load-lock chamber;
   a double arm accommodated in said non-reaction chamber for taking out a processed wafer from said first reaction chamber and supplying an unprocessed wafer to said reaction chamber, said double arm comprising a first arm and a second arm which are each linearly movable into and out of said chambers;

a first wafer elevating mechanism provided in said first reaction chamber;

a second wafer elevating mechanism provided in said non-reaction chamber;

a first driving means for driving said double arm, said first wafer elevating mechanism, and said second wafer elevating mechanism by a single driving source;

a selective engagement mechanism provided at said first reaction chamber and said non-reaction chamber and said wafer elevating mechanisms, for selectively engaging said first driving means with any one of said wafer elevating mechanisms at said reaction chamber and said non-reaction chamber so as to drive said double arm and said wafer elevating mechanism at said selected chamber; and a second driving means for rotating said double arm, said first wafer elevating mechanism, and said second wafer elevating mechanism by a second drive source.

2. The vacuum processing apparatus as claimed in claim 1, wherein said first driving means comprises:

a first cam plate which is rotated by said first single drive source, said first cam plate having a first grooved cam portion;

a first cam follower for engaging said first grooved cam portion to move said first cam follower along said first grooved cam portion of said first cam plate in accordance with rotation of said first cam plate so as to drive one of said first and second arms of said double arm;

a second cam plate which is rotated by said single drive source, said second cam plate having a second grooved cam portion;

a second cam follower for engaging said second grooved cam portion to move said second cam follower along said second grooved cam portion of said second cam plate in accordance with rotation of said second cam plate so as to drive said other of said first and second arms of said double arm;

a third cam plate which is rotated by said single drive source, said third cam plate having a third grooved cam portion;

a third cam follower for engaging said third grooved cam portion to move said third cam follower along said third grooved cam portion of said third cam plate in accordance with rotation of said third cam plate so as to transfer a driving force to a corresponding one of said first and second wafer elevating mechanisms at said selected chamber through engagement with said selective engagement mechanism; and a cam shaft for holding said first, second, and third cam plates, and said cam shaft rotating forward at one of said first reaction and non-reaction chambers and said cam shaft rotating backward at the next of said first reaction and non-reaction chambers.

3. The vacuum processing apparatus as claimed in claim 2, wherein said driving means includes a lever for transferring oscillating motion of said third cam follower into upward-and-downward movement of said first wafer elevating mechanism, and said first wafer elevating mechanism comprises:

a member having a first end removably connectable to said lever of said driving means, a middle portion supported by a supporting point, and a second end, wherein said member is pivotal about said supporting point; and a shaft connected to said second end of said member for moving a wafer upward and downward in accordance with pivotal movement of said member.

4. The vacuum processing apparatus as claimed in claim 3, wherein each of said first and second arms of said double arm comprises:

a first front link;

a first rear link pivotally connected to said first front link;

a second front link;

a second rear link pivotally connected to said second front link;

a gear box including a first gear connected to said first front link and said first rear link, and a second gear connected to said second front link and said second rear link, said first and second gears being connected to each other; and a wafer receiving member connected to said second front link and second rear link, said four links forming a parallel link with said gear box, and one of said first front link and said first rear link being connected to said driving means such that said wafer receiving member is movable along a linear path by said driving means.

5. The vacuum processing apparatus as claimed in claim 1, wherein said second driving means comprises an index unit and a motor for driving said index unit.

6. The vacuum processing apparatus as claimed in claim 1, further comprising a second reaction chamber.

7. A vacuum processing apparatus comprising:

a first reaction chamber;

a second reaction chamber;

a non-reaction chamber comprising a load-lock chamber or a double load-lock chamber;

a double arm disposed in said non-reaction chamber for taking out a processed wafer from said reaction chambers and supplying an unprocessed wafer to said reaction chambers, said double arm comprising a first arm and a second arm;

a first wafer elevating mechanism provided in said first reaction chamber;

a second wafer elevating mechanism provided in said second reaction chamber;

a first driving means for driving said double arm and effecting linear motion of said first and second arms, said first driving means being selectively engageable with said first wafer elevating mechanism and said second wafer elevating mechanism;

a driving motor for driving said first driving means, wherein said first driving means, said first wafer elevating mechanism, and said second wafer elevating mechanism are operated by said driving motor; and a second driving means for rotating said double arm, said first wafer elevating mechanism, and said second wafer elevating mechanism by a second drive source.

8. The vacuum processing apparatus as claimed in claim 7, wherein said first driving means comprises:

a first cam plate which is rotated by said first single drive source, said first cam plate having a first grooved cam portion;

a first cam follower for engaging said first grooved cam portion to move said first cam follower along said first grooved cam portion of said first cam plate in accordance with rotation of said first cam plate so as to drive one of said first and second arms of said double arm;

a second cam plate which is rotated by said single drive source, said second cam plate having a second grooved cam portion;

a second cam follower for engaging said second grooved cam portion to move said second cam follower along said second grooved cam portion of said second cam plate in accordance with rotation of said second cam plate so as to drive said other of said first and second arms of said double arm;

a third cam plate which is rotated by said single drive source, said third cam plate having a third grooved cam portion;

a third cam follower for engaging said third grooved cam portion to move said third cam follower along said third grooved cam portion of said third cam plate in accordance with rotation of said third cam plate so as to transfer a driving force to a corresponding one of said first and second wafer elevating mechanisms at said selected chamber through engagement with said first driving means; and a cam shaft for holding said first, second, and third cam plates, and said cam shaft rotating forward at one of said first reaction chamber, said second reaction chamber and said non-reaction chamber and said cam shaft rotating backward at the next of said first reaction chamber, said second reaction chamber and said non-reaction chamber.

9. The vacuum processing apparatus as claimed in claim 8, wherein said first driving means includes a lever which is selectively engageable with said first and second wafer elevating mechanisms, and each of said first and second wafer elevating mechanisms comprises:

a member having a first end removably connectable to said lever of said first driving means, a middle portion supported by a supporting point, and a second end, wherein said member is pivotal about said supporting point; and a shaft connected to said second end of said member for moving a wafer upward and downward in accordance with pivotal movement of said member.

10. The vacuum processing apparatus as claimed in claim 9, wherein each of said first and second arms of said double arm comprises:

a first front link;

a first rear link pivotally connected to said first front link;

a second front link;

a second rear link pivotally connected to said second front link;

a gear box including a first gear connected to said first front link and said first rear link, and a second gear connected to said second front link and said second rear link, said first and second gears being connected to each other; and a wafer receiving member connected to said second front link and second rear link, said four links forming a parallel link with said gear box, and one of said first front link and said first rear link being connected to said driving means such that said wafer receiving member is movable along a linear path by said driving means.

11. The vacuum processing apparatus as claimed in claim 7, wherein said second driving means comprises an index unit and a motor for driving said index unit.

* * * * *